US009102857B2

(12) United States Patent
Weaver et al.

(10) Patent No.: US 9,102,857 B2
(45) Date of Patent: Aug. 11, 2015

(54) METHODS OF SELECTING ONE OR MORE PHASE CHANGE MATERIALS TO MATCH A WORKING TEMPERATURE OF A LIGHT-EMITTING DIODE TO BE COOLED

(75) Inventors: Matt Weaver, Aptos, CA (US); James Kingman, Woodside, CA (US)

(73) Assignee: LUMENETIX, INC., Scotts Valley, CA (US)

( * ) Notice: Subject to any disclaimer, the term of this patent is extended or adjusted under 35 U.S.C. 154(b) by 1486 days.

(21) Appl. No.: 12/237,313

(22) Filed: Sep. 24, 2008

(65) Prior Publication Data

US 2009/0219726 A1     Sep. 3, 2009

Related U.S. Application Data

(60) Provisional application No. 61/032,989, filed on Mar. 2, 2008.

(51) Int. Cl.
     *F28D 17/00*      (2006.01)
     *C09K 5/06*      (2006.01)
     *F21S 8/10*      (2006.01)
     (Continued)

(52) U.S. Cl.
CPC .............. *C09K 5/063* (2013.01); *F21S 48/328* (2013.01); *F21V 29/006* (2013.01); *F21V 29/20* (2013.01); *F21V 29/74* (2015.01); *F21V 29/85* (2015.01); *F21Y 2101/02* (2013.01);
(Continued)

(58) Field of Classification Search
CPC ... H01L 23/427; H01L 23/42; H01L 23/4275; H01L 33/648; H05K 1/0203; C09K 5/063; F28F 23/00; Y02E 60/145; F21V 29/22; F21V 29/24; F21V 29/006; F21Y 2101/02; F28D 20/02; F28D 20/021; F28D 2021/0028; F28D 2021/0029
USPC ..................................... 165/10, 236
See application file for complete search history.

(56) References Cited

U.S. PATENT DOCUMENTS 3,316,497 A     4/1967   Brooks
3,390,341 A     6/1968   Kline
(Continued)

FOREIGN PATENT DOCUMENTS

CN         1976643 A     6/2007
CN       101334155 A    12/2008
(Continued)

OTHER PUBLICATIONS

Shibata, Masanobu, "Internal Resistance of an LED as a function of Temperature", Jan. 2010, ISB Journal of Physics, http://www.isb.ac.th/HS/JoP/index.html, pp. 1-4.*
(Continued)

*Primary Examiner* — Ljiljana Ciric
(74) *Attorney, Agent, or Firm* — Perkins Coie LLP

(57) ABSTRACT

A phase change material (PCM) is used for thermal storage for LED-based lighting systems. The PCM is placed in multiple sealed containers in thermal contact with the LED to be cooled. The PCM is selected such that its melting point temperature is substantially the preferred operating temperature of the LED. When the LED is on, the PCM absorbs and stores some of the heat generated by the LED, while some of the generated heat is convected away from the LED. The PCM is selected based upon its heat storage capabilities to cool the LED when the lighting system is operated for a cyclical application.

8 Claims, 6 Drawing Sheets

(51) Int. Cl.
*F21V 29/00* (2015.01)
*F21V 29/74* (2015.01)
*F21V 29/85* (2015.01)
*F21Y 101/02* (2006.01)
*H01L 23/427* (2006.01)
*H01L 33/64* (2010.01)

(52) U.S. Cl.
CPC .......... *H01L 23/4275* (2013.01); *H01L 33/641* (2013.01); *H01L 33/648* (2013.01); *H01L 2924/0002* (2013.01)

(56) References Cited

U.S. PATENT DOCUMENTS

| | | | |
|---|---|---|---|
| 3,654,563 A | | 4/1972 | Hesler et al. |
| 3,720,198 A | | 3/1973 | Laing et al. |
| 4,237,023 A | | 12/1980 | Johnson |
| 4,419,716 A | | 12/1983 | Koo |
| 4,504,402 A | | 3/1985 | Chen et al. |
| 4,581,285 A | | 4/1986 | Mahefkey, Jr. |
| 4,617,332 A | * | 10/1986 | Salyer et al. ............. 524/4 |
| 4,749,951 A | | 6/1988 | Tanaka |
| 4,797,160 A | * | 1/1989 | Salyer ............. 428/921 |
| 5,087,508 A | * | 2/1992 | Beck ............. 428/195.1 |
| 5,315,154 A | | 5/1994 | Elwell |
| RE34,880 E | * | 3/1995 | Salyer ............. 106/660 |
| 5,722,482 A | | 3/1998 | Buckley |
| 5,831,831 A | * | 11/1998 | Freeland ............. 361/704 |
| 5,890,794 A | * | 4/1999 | Abtahi et al. ............. 362/294 |
| 6,104,611 A | * | 8/2000 | Glover et al. ............. 361/700 |
| 6,227,285 B1 | * | 5/2001 | Hildebrand et al. ............. 165/10 |
| 6,307,871 B1 | * | 10/2001 | Heberle ............. 372/34 |
| 6,392,883 B1 | * | 5/2002 | Ali ............. 361/679.52 |
| 6,452,217 B1 | * | 9/2002 | Wojnarowski et al. ....... 362/294 |
| 6,482,332 B1 | | 11/2002 | Malach |
| 6,652,771 B2 | * | 11/2003 | Carn ............. 252/70 |
| 6,793,856 B2 | * | 9/2004 | Hartmann et al. ............. 264/141 |
| 6,835,334 B2 | * | 12/2004 | Davis et al. ............. 264/4.32 |
| 7,002,800 B2 | * | 2/2006 | Elias et al. ............. 361/700 |
| 7,252,140 B2 | | 8/2007 | Glezer et al. |
| 7,279,970 B2 | | 10/2007 | Yokoyama et al. |
| 7,316,265 B2 | * | 1/2008 | Searls et al. ............. 165/104.33 |
| 7,329,033 B2 | | 2/2008 | Glovatsky et al. |
| 7,345,320 B2 | * | 3/2008 | Dahm ............. 362/26 |
| 7,461,951 B2 | * | 12/2008 | Chou et al. ............. 362/294 |
| 7,575,354 B2 | | 8/2009 | Woodward |
| 7,676,915 B2 | * | 3/2010 | Ter-Hovhannissian ......... 29/840 |
| 7,781,900 B2 | * | 8/2010 | Carmona et al. ............. 257/789 |
| 7,810,965 B2 | | 10/2010 | Weaver |
| 7,828,465 B2 | * | 11/2010 | Roberge et al. ............. 362/294 |
| 7,886,809 B2 | * | 2/2011 | Searls et al. ............. 165/10 |
| 7,959,327 B2 | * | 6/2011 | Lai et al. ............. 362/294 |
| 7,969,075 B2 | | 6/2011 | Weaver et al. |
| 7,989,839 B2 | * | 8/2011 | Dahm ............. 257/99 |
| 8,021,023 B2 | * | 9/2011 | Liu ............. 362/294 |
| 8,031,393 B2 | * | 10/2011 | Narendran et al. ............. 362/555 |
| 8,047,690 B2 | * | 11/2011 | Weaver ............. 362/294 |
| 8,123,389 B2 | | 2/2012 | Hitchcock et al. |
| 8,192,841 B2 | * | 6/2012 | Amundson et al. ............. 428/402 |
| 8,262,263 B2 | * | 9/2012 | Dinh ............. 362/294 |
| 8,427,036 B2 | * | 4/2013 | Weaver et al. ............. 313/46 |
| 8,632,227 B2 | | 1/2014 | Weaver |
| 8,783,894 B2 | * | 7/2014 | Hitchcock et al. ............. 362/294 |
| 2002/0033247 A1 | * | 3/2002 | Neuschutz et al. ............. 165/10 |
| 2002/0147242 A1 | | 10/2002 | Salyer et al. |
| 2004/0057234 A1 | | 3/2004 | Mohacsi |
| 2004/0113044 A1 | | 6/2004 | Ishiguchi |
| 2004/0159422 A1 | | 8/2004 | Zuo et al. |
| 2005/0030416 A1 | | 2/2005 | Kametani et al. |
| 2005/0082043 A1 | | 4/2005 | Sarraf |
| 2005/0158687 A1 | | 7/2005 | Dahm |
| 2005/0196720 A1 | * | 9/2005 | Ostler et al. ............. 433/29 |
| 2005/0231983 A1 | | 10/2005 | Dahm |
| 2005/0276053 A1 | | 12/2005 | Nortrup et al. |
| 2006/0044059 A1 | | 3/2006 | Yokoyama et al. |
| 2006/0044804 A1 | * | 3/2006 | Ono et al. ............. 362/294 |
| 2006/0086096 A1 | | 4/2006 | Ghoshal |
| 2006/0151146 A1 | | 7/2006 | Chou et al. |
| 2007/0114010 A1 | | 5/2007 | Upadhya et al. |
| 2007/0125522 A1 | | 6/2007 | Stefanoski |
| 2007/0189012 A1 | * | 8/2007 | Huang et al. ............. 362/294 |
| 2007/0230183 A1 | | 10/2007 | Shuy |
| 2007/0253202 A1 | | 11/2007 | Wu et al. |
| 2007/0268694 A1 | | 11/2007 | Bailey et al. |
| 2007/0279862 A1 | | 12/2007 | Li |
| 2007/0279921 A1 | | 12/2007 | Alexander et al. |
| 2008/0094841 A1 | | 4/2008 | Dahm |
| 2008/0094850 A1 | | 4/2008 | Woodward |
| 2008/0285271 A1 | | 11/2008 | Roberge et al. |
| 2009/0021944 A1 | * | 1/2009 | Lee et al. ............. 362/294 |
| 2009/0219726 A1 | | 9/2009 | Weaver et al. |
| 2009/0219727 A1 | | 9/2009 | Weaver |
| 2009/0273921 A1 | * | 11/2009 | Chiang ............. 362/101 |
| 2010/0017688 A1 | | 1/2010 | Mead et al. |
| 2010/0096993 A1 | | 4/2010 | Ashdown et al. |
| 2010/0201241 A1 | | 8/2010 | Weaver et al. |
| 2010/0295468 A1 | | 11/2010 | Pedersen et al. |
| 2011/0057552 A1 | | 3/2011 | Weaver |
| 2011/0084608 A1 | | 4/2011 | Lin et al. |
| 2011/0134645 A1 | | 6/2011 | Hitchcock et al. |
| 2011/0303946 A1 | | 12/2011 | Weaver et al. |

FOREIGN PATENT DOCUMENTS

| | | |
|---|---|---|
| DE | 10 2005 054508 A1 | 5/2007 |
| EP | 0612105 A1 | 8/1994 |
| EP | 1717632 A1 | 11/2006 |
| JP | 2002057262 | 2/2002 |
| JP | 2004319658 | 11/2004 |
| JP | 2007538045 A | 10/2005 |
| JP | 2007080463 | 3/2007 |
| KR | 1020050047081 A | 5/2005 |
| KR | 1020060125185 | 6/2006 |
| KR | 1020080070001-1 A | 7/2008 |
| KR | 1020100009218-1 A | 1/2010 |
| KR | 20100017600 A | 2/2010 |
| WO | WO-02086795 A1 | 10/2002 |
| WO | WO-2006047240 A2 | 5/2006 |
| WO | WO-2009001254 A2 | 12/2008 |
| WO | WO-2009010987 A1 | 1/2009 |

OTHER PUBLICATIONS

Bera, S.C., et al., "Temperature Behavior and Compensation of Light-Emitting Diode", Nov. 2005, IEEE Photonics Technology Letters, vol. 17, No. 11, pp. 2286-2288.*
Co-pending U.S. Appl. No. 13/171,302, filed Jun. 28, 2011.
Notice of Allowance Mailed Jan. 20, 2012 in Co-pending U.S. Appl. No. 12/757,793, filed Apr. 9, 2010.
International Search Report PCT/US2009/001253 dated May 27, 2009.
International Search Report PCT/US2010/035653 Mailed Feb. 1, 2011, pp. 1-3.
Supplementary European Search Report EP 09717472 dated Nov. 30, 2011 pp. 1-12.
Written Opinion PCT/US2010/035653 Mailed Feb. 1, 2011, pp. 1-6.
Final Office Action Mailed Jan. 25, 2011 in Co-pending U.S. Appl. No. 12/368,936, filed Feb. 10, 2009.
Notice of Allowance Mailed Mar. 2, 2011 in Co-pending U.S. Appl. No. 12/368,936, filed Feb. 10, 2009.
Co-pending U.S. Appl. No. 13/403,853, filed Feb. 23, 2012.
Co-pending U.S. Appl. No. 12/370,521, filed Feb. 12, 2009.
Co-pending U.S. Appl. No. 12/368,936, filed Feb. 10, 2009.
Co-pending U.S. Appl. No. 12/757,793, filed Apr. 9, 2010.
Written Opinion PCT/US2009/001253 dated May 27, 2009 pp. 1-3.
International Search Report PCT/US2009/001293 dated Oct. 9, 2009 pp. 1-4.
Written Opinion PCT/US2009/001293 dated Oct. 9, 2009 pp. 1-7.
Non-Final Office Action Mailed Jul. 12, 2010 in Co-pending U.S. Appl. No. 12/370,521, filed Feb. 12, 2009.

(56) References Cited

OTHER PUBLICATIONS

International Search Report PCT/US2009/069290 dated Jul. 14, 2010, pp. 1-3.
Written Opinion PCT/US2009/069290 dated Jul. 14, 2010, pp. 1-3.
Co-pending U.S. Appl. No. 12/237,313, filed Sep. 24, 2008.
Behr, A.T. et al., "Nonlinearities of Capacitors Realized by MOSFET Gates", Proceedings of the International Symposium on Circuits and Systems, San Diego, May 10-13, 1992 [Proceedings of the International Symposium on Circuits and Systems, (ISCAS)], New York, IEEE, US, vol. 3, May 3, 1992, pp. 1284-1287, XP010061392 ISBN: 978-0-7803-0593-9.
Berkhout, M., "An Integrated 200-W Class-D Audio Amplifier", IEEE Journal of Solid-State Circuits, IEEE Service Center, Piscataway, NJ, US, vol. 38, No. 7, Jul. 1, 2003, pp. 1198-1206, XP001169604.
Gaalaas, E. et al., "Integrated Stereo Delta Sigma Class D Amplifier", IEEE Journal of Solid-State Circuits , IEEE Service Center, Piscataway, NJ, US [online] vol. 40, No. 12, Dec. 1, 2005, pp. 2388-2397, XP002504060, issn: 0018-9200, Retrieved from the Internet: URL:http://ieeexplore.ieee.org.[retrieved on Nov. 14, 2008, pp. 2388-2392].
Wang et al., "A Nonlinear Capacitance Cancellation Technique and and its Application to a CMOS Class AB Power Amplifier", 2001 IEEE Radio Frequency Integrated Circuits (RFIC) Symposium, Digest of Papers, Phoenix, AZ, May 20-22, 2001; [IEEE Radio Frequency Integrated Circuits Symposium], New York, NY, IEEE, US, May 20, 2001, pp. 39-42, XP010551317, ISBN: 978-0-7803-6601-5, pp. 40.
Co-pending U.S. Appl. No. 61/032,988, filed Mar. 2, 2008.
Co-pending U.S. Appl. No. 13/284,773, filed Oct. 28, 2011.
Co-pending U.S. Appl. No. 61/032,989, filed Oct. 28, 2011.
Co-pending U.S. Appl. No. 61/304,359, filed Feb. 12, 2010.
Non-Final Office Action Mailed Mar. 16, 2011 in Co-pending U.S. Appl. No. 12/892,696, filed Sep. 28, 2010.
Notice of Allowance Mailed Jul. 29, 2011 in Co-pending U.S. Appl. No. 12/892,696, filed Sep. 28, 2010.
Restriction Requirement Mailed Mar. 1, 2011 in Co-pending U.S. Appl. No. 12/237,313, filed Sep. 24, 2008.
Final Office Action Mailed Jan. 25, 2011 in Co-pending U.S. Appl. No. 12/358,936, filed Feb. 10, 2009.
Notice of Allowance Mailed Mar. 2, 2011 in Co-pending U.S. Appl. No. 12/358,936, filed Feb. 10, 2009.
Non-final Office Action Mailed Jun. 20, 2011 in Co-pending U.S. Appl. No. 12/757,793, filed Apr. 9, 2010.
Notice of Allowance Mailed Sep. 27, 2011 in Co-pending U.S. Appl. No. 12/757,793, filed Apr. 9, 2010.
Co-pending U.S. Appl. No. 12/892,696, filed Sep. 28, 2010.
Notice of Allowance Mailed Sep. 1, 2010 in Co-pending U.S. Appl. No. 12/370,521, filed Feb. 12, 2009.
Non-Final Office Action Mailed Oct. 28, 2010 in Co-pending U.S. Appl. No. 12/368,936, filed Feb. 10, 2009.
Notice of Allowance Mailed May 15, 2014, in Co-pending U.S. Appl. No. 12/403,853 by Hitchcock, R., et al., filed Feb. 23, 2012.
Office Action mailed Jun. 22, 2012, in Canadian Patent Application No. 2,716,832 filed Feb. 27, 2009, pp. 1-3.
Office Action mailed Apr. 5, 2012, in Chinese Patent Application No. 200980115871.5 filed Feb. 27, 2009, pp. 1-3.
Office Action mailed Dec. 6, 2012, in Chinese Patent Application No. 200980115871.5 filed Feb. 27, 2009, pp. 1-3.
Notification of Reasons of Refusal mailed Jul. 6, 2012, in Japanese Patent Application No. 2010-548744 filed Feb. 27, 2009, pp. 1-3.
Office Action mailed Jul. 11, 2012, in Canadian Patent Application No. 2,716,829 filed Feb. 27, 2009, pp. 1-2.
Office Action mailed Jan. 29, 2013, in Chinese Patent Application No. 200980115236.7 filed Feb. 27, 2009, pp. 1-8.
Notification of Reasons of Refusal mailed Mar. 8, 2013, in Japanese Patent Application No. 2010-549638 filed Feb. 27, 2009, pp. 1-4.
Non-final Office Action Mailed Jun. 17, 2013, in Co-pending U.S. Appl. No. 12/403,853 by Hitchcock, R., et al., filed Feb. 23, 2012.
Non-Final Office Action mailed Sep. 7, 2012 in Co-pending U.S. Appl. No. 13/171,302, filed Jun. 28, 2011.
Notice of Allowance Mailed Mar. 11, 2013 in Co-pending U.S. Appl. No. 13/171,302, filed Jun. 28, 2011.
Non-Final Office Action Mailed Sep. 13, 2012 in Co-pending U.S. Appl. No. 13/284,773, filed Oct. 28, 2011.
Final Office Action mailed Mar. 12, 2013 in Co-Pending U.S. Appl. No. 13/284,773, filed Oct. 28, 2011.
Notice of Allowance mailed Jun. 13, 2013, in Co-Pending U.S. Appl. No. 13/284,773 by Weaver, M., filed Oct. 28, 2011.

\* cited by examiner

METHODS OF SELECTING ONE OR MORE PHASE CHANGE MATERIALS TO MATCH A WORKING TEMPERATURE OF A LIGHT-EMITTING DIODE TO BE COOLED

CLAIM OF PRIORITY

This application claims priority to U.S. Provisional Patent Application No. 61/032,989 entitled "Thermal Storage System In LED Lamps", which was filed on Mar. 2, 2008 by Matthew Weaver, the contents of which are expressly incorporated by reference herein.

BACKGROUND

A light-emitting diode (LED) is a semiconductor diode that emits incoherent narrow-spectrum light when electrically biased in the forward direction of the p-n junction. LEDs produce more light per watt than incandescent bulbs. LEDs are often used in battery powered or energy-saving devices and are becoming increasingly popular in higher power applications such as flashlights, area lighting, and regular household light sources.

LED performance largely depends on the ambient temperature of its operating environment. Driving the LED hard in high ambient temperatures may result in overheating of the LED package, resulting in poor performance and eventually leading to device failure. Consequently, adequate heat-sinking or cooling is required to maintain a long lifetime for the LED, which is especially important in automotive, medical, and military applications where the LED must operate over a wide range of temperatures and is required to have a low failure rate.

Generally, LED cooling systems rely largely on convective mechanisms to remove heat. Heat convection refers to heat transport by an external source, such as a fan, or heat transfer caused by buoyancy forces resulting from density differences caused by temperature variations in a fluid. The use of passive thermally conductive materials that absorb the heat and slowly rise in temperature would be highly impractical for longer term thermal dissipation. For a non-limiting example, the size of a piece of aluminum needed to cool LEDs used in a typical lighting application for a time span of eight hours or more would be so large that the aluminum would never come to saturation and the LEDs would unacceptably spike up in temperature. The reason is that the volume of the aluminum required to store the heat generated by the LED is beyond the size constraints of the LED bulb envelope, the amount of aluminum required for this application is impractically massive, and aluminum inefficiently facilitates heat convection because it experiences a linear temperature rise proportional to stored heat so that the thermal capacity required for a given LED power level and operating time is very large.

The foregoing examples of the related art and limitations related therewith are intended to be illustrative and not exclusive. Other limitations of the related art will become apparent upon a reading of the specification and a study of the drawings.

SUMMARY

A phase change material (PCM) is used for thermal storage for lighting systems, including LED-based lighting systems. The PCM is placed in a sealed container in close contact with the lighting system to be cooled. Because the PCM material may have low thermal conductivity, specific PCM containment geometries should be used such that sufficient thermal coupling to the LEDs occurs in order to move sufficient heat into the PCM mass. The PCM is selected such that its melting point temperature is approximately the preferred operating temperature of the lighting system. Examples of PCMs having a melting point temperature near the operating temperature of certain LEDs include sodium citrates and sodium phosphates.

When the PCM absorbs heat from the lighting system as a solid, its temperature rises. However, when the PCM reaches its melting point, the temperature of the PCM stays at its melting point temperature until the phase of the PCM changes completely from a solid to a liquid. Then the PCM continues to rise in temperature. Because a PCM can absorb a large amount of heat during its change of phase from a solid to a liquid, the PCM can store a large amount of heat generated by the lighting system while maintaining its temperature at its melting point temperature.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Described in detail below is a method of providing thermal storage for a lighting system, such as an LED-based lighting system. The thermal storage system uses a phase change material.

Various aspects of the invention will now be described. The following description provides specific details for a thorough understanding and enabling description of these examples. One skilled in the art will understand, however, that the invention may be practiced without many of these details. Additionally, some well-known structures or functions may not be shown or described in detail, so as to avoid unnecessarily obscuring the relevant description. Although the diagrams depict components as functionally separate, such depiction is merely for illustrative purposes. It will be apparent to those skilled in the art that the components portrayed in this figure may be arbitrarily combined or divided into separate components.

The terminology used in the description presented below is intended to be interpreted in its broadest reasonable manner, even though it is being used in conjunction with a detailed description of certain specific examples of the invention. Certain terms may even be emphasized below; however, any terminology intended to be interpreted in any restricted manner will be overtly and specifically defined as such in this Detailed Description section.

Figure 1:
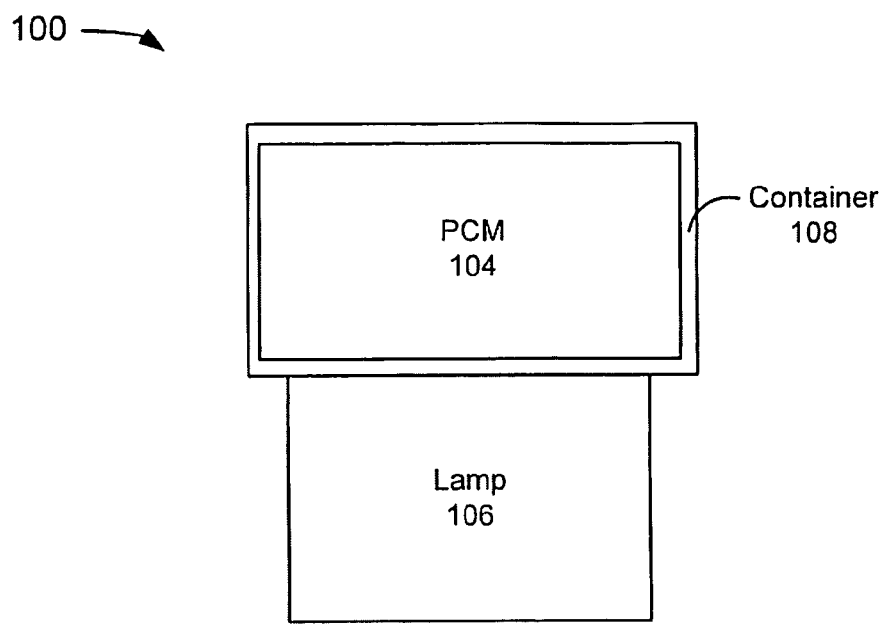
FIG. 1 depicts an example of a system that uses a phase change material to provide thermal storage for a lighting system.

FIG. 1 depicts a block diagram of a thermal storage system 100 intended for lighting applications. In the example of FIG. 1, the system 100 includes one or more lamps 106 and one or more phase change materials 104, each enclosed in a sealed container 108.

The lamp 106 may include any type of LED-based lighting system including, but not limited to, LEDs used in high intensity lamps such as used with automotive applications or spot lights and LED lamps mounted in enclosed quarters such as within recessed cans.

In the example of FIG. 1, a phase change material (PCM) 104 is used to absorb the heat generated by the lamp 106. A PCM is a material that has a high heat of fusion such that a large amount of heat energy must be applied to change the PCM from a solid to a liquid. At temperatures below and above a PCM's melting point, the PCMs temperature rises as it absorbs heat. However, at the PCM's melting point, the PCM absorbs heat without increasing in temperature until a change of state from solid to liquid of the entire mass has occurred.

Figure 2:
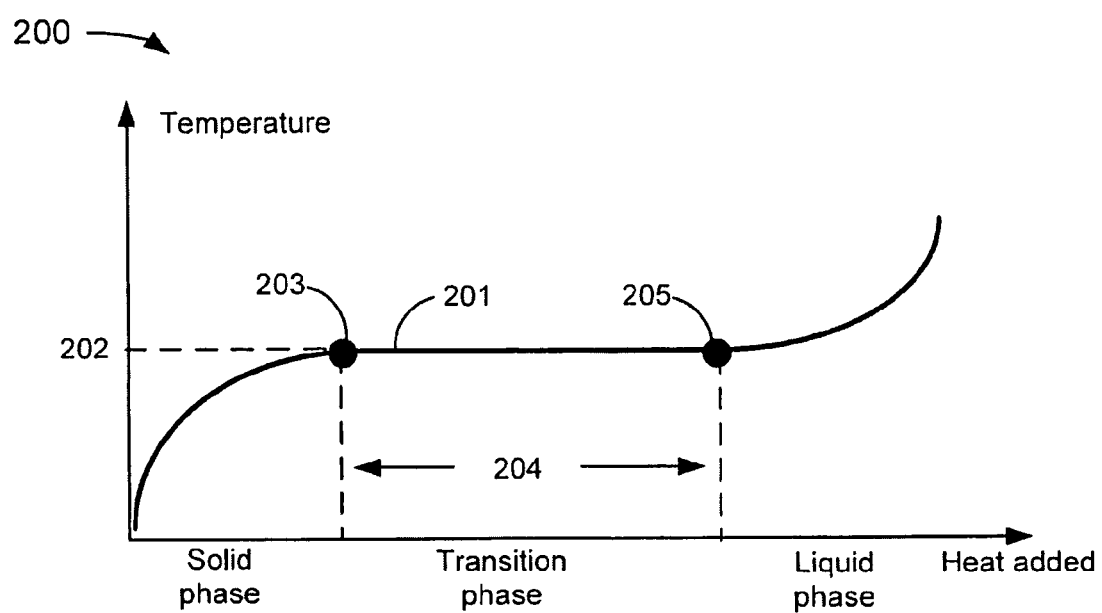
FIG. 2 depicts an example of characteristic temperature change of a phase change material as heat is added to the material.

FIG. 2 illustrates the characteristic pattern of temperature change of a PCM 104 as heat is added to the PCM over time. At the left side of curve 201, the PCM is in a solid phase. As heat is added to the PCM, we move along the curve 201 toward the right. At point 203 on curve 201, the PCM reaches its melting point temperature 202 and enters a phase transition state 204. The temperature of PCM 104 is clamped at this melting point temperature 202 and continues to absorb heat until the PCM has reached the liquid phase at point 205. As heat continues to be added to the PCM, to the right of point 205, the temperature of the PCM again starts to increase.

A sealed container 108 is used to contain the PCM because the PCM alternates between the solid and liquid states. In addition, the PCM has a precise water content, and the container 108 prevents the water in the PCM from dehydrating to the atmosphere. The container 108 tends to be "gas tight", that is, it tends to be substantially impermeable to gases. In one embodiment, the sealed container 108 is metallic or metallized. In one embodiment the sealed container 108 may be plastic and coated with a metal film for blocking moisture transfer over many years of use.

A number of features stem from the thermal storage scheme shown in FIG. 1. Notably, the temperature clamping effect of the PCM 104 effectively clamps its own temperature as well as the temperature of the lamp 106 at the melting point temperature 202 until a complete change of phase from solid to liquid has occurred. During the clamping period, PCM 104 absorbs all or at least a portion of the heat or energy released by the lamp 106 while keeping its temperature steady so the lamp 106 may continue to work within its normal working temperature range. This is especially important for LED-based lamps because the available output capacity, efficiency, and life of an LED are highly dependent upon the temperature reflected back to the silicon-based device. Using a PCM for thermal storage allows an LED to be driven to its full power. Consequently, enormous cost savings may be achieved because the same amount of lighting is generated with approximately half the number of LEDs typically used in conventional implementations within the industry.

In one embodiment, the phase change heat storage capabilities of PCM 104 can be designed to substantially match the typical cyclical usage over time of lamp 106 in a residential or commercial setting, for example four to 14 hours on and the rest of the time off. The lamp 106 may be designed to convect away part of the heat energy generated when the lamp is on, for example half of the generated energy, and to store the remaining portion of heat energy within PCM 104. When the lamp is off, the heat stored in PCM 104 is slowly released as the state of the material changes back to a solid state. The effective spreading over time of the thermal discharge lowers the cooling capacity requirement of a building and increases the overall building efficiency because less energy is used to cool lamp 106.

Figure 5:
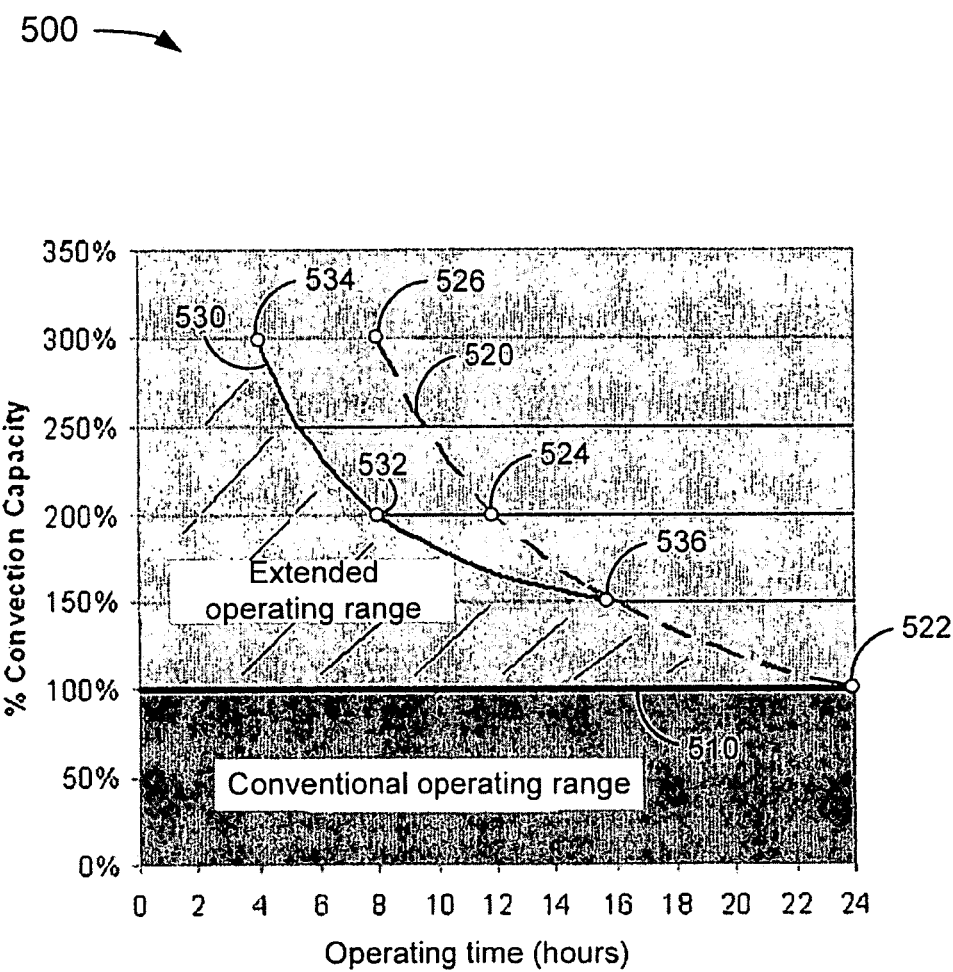
FIG. 5 shows example operating ranges for a convection-based LED lighting system operated continuously, a convection-based LED lighting system operated cyclically, and an LED lighting system that uses phase change material for thermal storage.

FIG. 5 shows a graph 500 of example operating ranges for a convection-based LED lighting system that is continuously operated, a convection-based LED lighting system operated cyclically, and an LED lighting system that uses phase change material for thermal storage for a cyclical application. Curve 510 shows an example of the maximum operating range of a convection-based LED lighting system that is continuously operated. The maximum convection capacity of this pure convection system is referred to as 100% convection capacity and is the baseline against which the other systems are compared. Thus, a reference to 200% convection capacity indicates that the amount of heat energy that can be discharged by a system is twice the amount that could be discharged by the baseline system. The continuously operated system may be operated at any lower power output which requires a lower convection capacity and is shown by the area below curve 510 denoted 'conventional operating range' in graph 500.

Curve 520 shows an example of the maximum operating range of a convection-based lighting system that is operated over a fixed duty cycle for a cyclical application over a twenty-four hour period. For the example of 100% duty cycle (point 522 on curve 520), the curve 520 crosses curve 510 because the system is operated continuously. For the example of a 50% duty cycle where the lighting system is on continuously for 12 hours out of a 24-hour time period (point 524 on curve 520), the cyclical system would have twice (200%) the convection capacity of the continuously operated lighting system because the cyclical system would only operate half the time of the continuously operating system and thus have 12 hours to discharge the absorbed heat energy during the off portion of the duty cycle. Similarly, for the example of a 33% duty cycle (point 526 on curve 520), the cyclical system would have three times (300%) the convection capacity of the continuously operated lighting system. The cyclically operated system may be operated at any lower power output or lower duty cycle which requires a lower convection capacity and is shown by the area below curve 520 in graph 500.

Curve 530 shows an example of the operating range of the LED lighting system that uses phase change material for thermal storage. The design criteria for this example lighting system required the lamp to have sufficient PCM thermal storage capacity to provide 200% convection capacity during an operational time span of 8 hours (point 532). This same lamp can provide 300% convection capacity for an operational time span of 4 hours for applications such as a spot light, a garage door opener, a closet, or a restroom (point 534), or 150% convection capacity during an operational time span of 16 hours for applications such as an extended commercial application, street light or retail application (point 536). The lighting system can also be operated at any lower power output or lower duty cycle which requires a lower convection capacity and is shown by the area below curve 530 denoted 'extended operating range' in graph 500.

In one embodiment, a graph similar to graph 500 can be used is to present lighting system designs to customers and/or designers. For example, customers and/or designers can define their lighting requirements by specifying maximum operational duty cycles and maximum output power needed and graphs displaying various available lighting systems designs can be used to help select an appropriate lighting system.

In one embodiment, a graph similar to graph 500 can be used by an electrical system inspector or building inspector to ensure that the lighting system meets applicable electrical code or building safety requirements.

In the example of FIG. 1, when lamp 106 is used in down light applications, the lamp 106 is mounted in a recessed can that may retain the heat in the enclosed quarters when a convection-only cooling system is deployed. In this type of application, a PCM 104 in the thermal storage scheme 100 allows full rated performance of lamp 106 by first diverting the thermal losses from lamp 106 into PCM 104 over a period of time before discharging the heat from PCM 104 after lamp 106 is turned off.

Another application of the thermal storage scheme devised in FIG. 1 is the use of high intensity LED lamps 106 for automotive applications with cyclical usage patterns. In this type of application, there is plenty of access to convective cooling when the automobile is moving. When the automobile stops, however, lamp 106 would burn out in minutes without adequate cooling, dimming, or using an impractically large volume of passive materials for absorbing the heat. With the storage capability of PCM 104, however, the temperature of the lamp 106 would be clamped at its operating temperature, allowing lamp 106 to continue to work at full intensity even when the automobile is stopped.

In the example of FIG. 1, a specific and elevated phase change temperature of PCM 104 enables greater average convection when compared to a simple large passive thermal mass that is limited to the same peak temperature. A large passive thermal mass limited to the same peak temperature as PCM 104 will operate at half the peak temperature on average, resulting in roughly half the average convection. Consequently, a simple thermal mass soaks up nearly twice as much heat during the heating cycle and releases heat at half the rate of a comparable PCM 104 limited to the same peak temperature. This distinction is significant in a cyclical application of an LED light source, where the peak temperature of the LED must be controlled to maximize the life of the LED and the lumens output by the LED, and the average convection must be maximized in order to maximize the available duty cycle of the LED in cyclical applications.

In the example of FIG. 1, PCM 104 may be an ordinary, low cost, and non-toxic substance, such as certain types of eutectic salts that have a phase change occurring at or near the ideal operating temperature for an LED. The types of PCM 104 to be used can be determined based on the volume of the material that could be stored in an ordinary lamp 106 which, when combined with an effective convection scheme with phase changes, will operate for periods consistent with example graph 500 for the associated applications.

In a preferred embodiment, a specific type of PCM 104 can be a eutectic hydrated salt, such as a sodium citrate or a sodium phosphate. Particularly useful are sodium citrates that have a phase transition temperature occurring between 48° C.-58° C. and sodium phosphates that have a phase transition temperature occurring around 70° C. Other salts, such as various nitrates, or paraffins may also be used. However, they may exhibit inferior thermal performance or safety attributes.

In some embodiments, the PCM salts can be combined with specific nucleating agents to minimize super heating and super-cooling. In addition, PCM 104 can also be combined with stabilization agents to minimize permanent separation/segregation of salt and water components of the PCM during the many cycles of melting and freezing that occur over the lifetime of the lighting system.

One advantage to a PCM-based thermal storage system is that the PCM may be selected such that its melting point approximately matches the operating temperature of a particular LED in order to directly manage the more temperature sensitive LEDs. For a non-limiting example, in RGB (red green blue) light mixing applications, the output capacity of the lighting device has been very limited because of the thermal sensitivity of red LEDs. By using the storage scheme 100 with a lower temperature PCM, a red LED can be driven to full power. Consequently, the cost of these types of products is lowered for a given output, thus allowing them to enter more mass market applications where the user is not only interested in dimming the lights but also in tuning the their color. In some cases, it may also be cost effective to use different types of PCMs within the same light source 106 to further tune the capacity of different types of LEDs.

Figure 3:
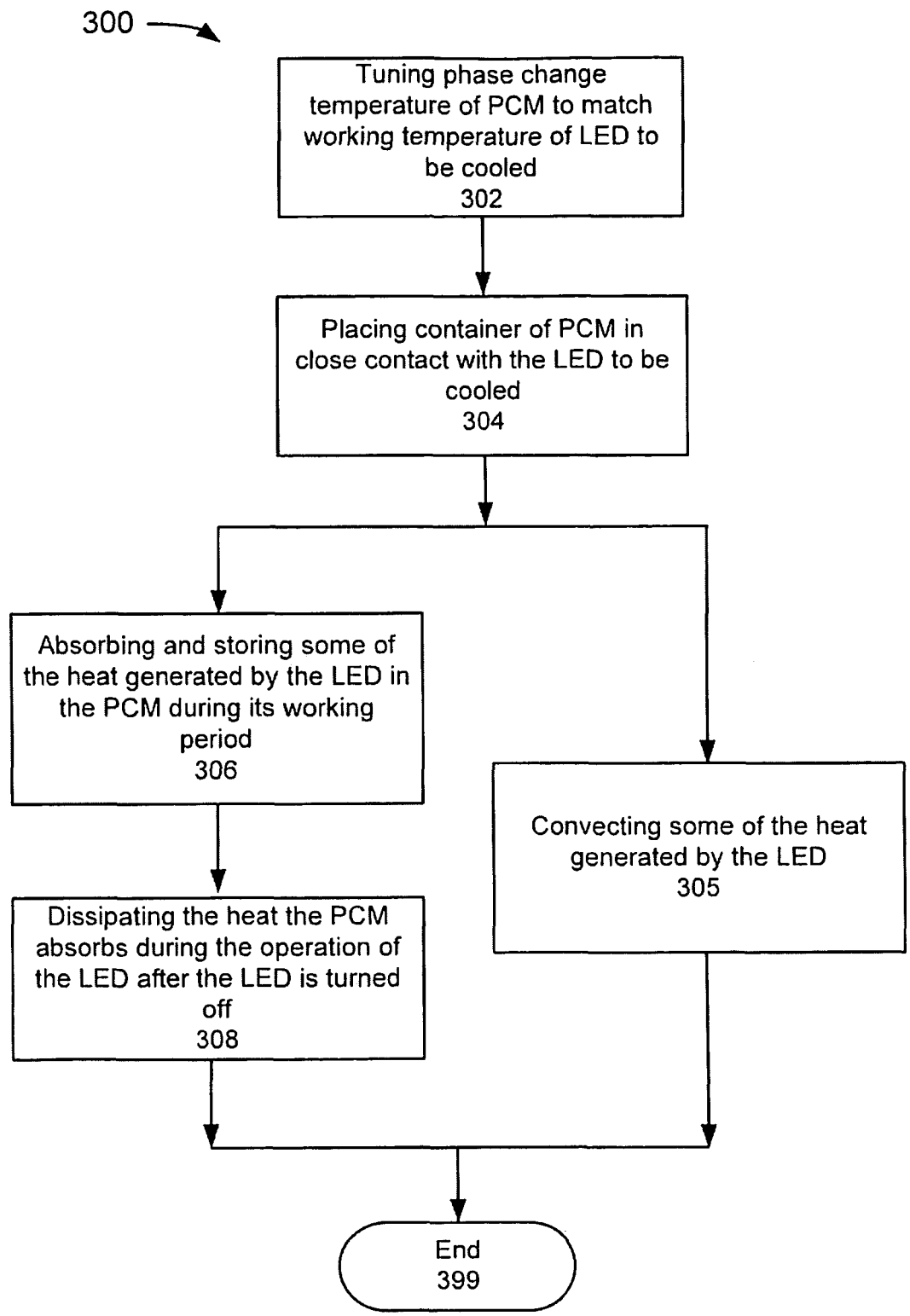
FIG. 3 depicts a flowchart of an example of a process to support thermal storage for LED lighting using phase change material.

FIG. 3 depicts a flowchart 300 of an example of a process for using a phase change material for thermal storage for LED lighting. Although this figure depicts functional steps in a particular order for purposes of illustration, the process is not limited to any particular order or arrangement of steps. One skilled in the art will appreciate that the various steps portrayed in this figure could be omitted, rearranged, combined and/or adapted in various ways.

In the example of FIG. 3, the flowchart 300 starts at block 302, where the phase change temperature of a PCM is tuned to substantially match the working temperature of the LED to be cooled. Such tuning can be achieved by choosing the appropriate types and/or combinations of materials as well as the addition of nucleating or stabilizing agents as discussed above.

The flowchart 300 continues to block 304 where the container of the PCM is placed in close contact with the LED (or the lighting source utilizing it) to be cooled.

The flowchart 300 then continues in two parallel paths. In the first path, at block 306, the PCM absorbs and stores at least some of the heat generated by the LED after the lighting source utilizing the LED is turned on. During the heat absorbing process, once the PCM reaches its melting point, the temperature of the PCM remains at that temperature which substantially corresponds to the working temperature of the LED while the PCM changes its state. Consequently, the LED does not heat up beyond its ideal working temperature.

The first path of flowchart 300 continues to block 308 where the PCM dissipates the heat it absorbed during the operation of the LED after the lamp is turned off. The first path of flowchart 300 ends at block 399.

In the second parallel path, block 304 continues to block 305 where some of the heat generated by the LED is convected away either actively or due to temperature gradients between the LED source and the surrounding environment. The second path of flowchart 300 ends at block 399.

Figure 4:
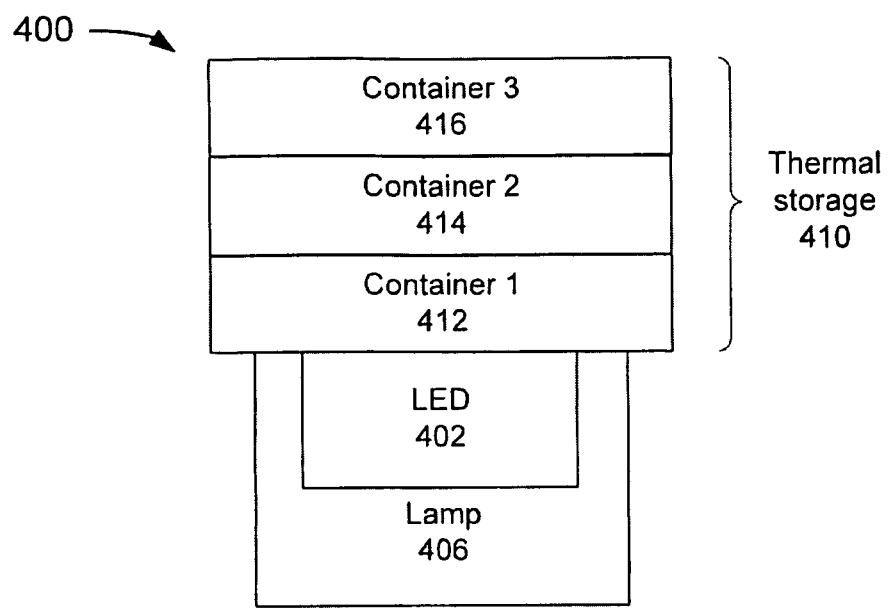
FIG. 4 depicts an example of a system to support thermal storage for LED lighting using phase change material in stacked containers.

FIG. 4 depicts an example of a system 400 that supports thermal storage for LED lighting using stacked layers of phase change material. In the example of FIG. 4, the system 400 includes one or more lamps 406 that utilizes one or more LEDs 402 and thermal storage 410 having multiple stacked containers 412, 414, 416. Three stacked containers are shown in system 400, but it will be apparent to a person skilled in the art that greater or fewer containers may be used. In one embodiment, each stacked container is sealed and holds a PCM material. The PCM material in the stacked containers 412, 414, 416 may or may not be the same material.

PCMs exhibit relatively poor thermal conductive coefficients when compared to metallic conductors. Consequently, simple bulk volumes of PCMs present unacceptable thermal resistance and an unacceptable temperature gradient through the solid mass as the melt line progresses deeper and deeper into the solid mass. In addition, the height of a volume of PCM should be minimized in order to reduce the gravitational buoyant gradient driving it. Thus, PCM containers 412, 414, 416 are typically not very deep and may resemble a can lid.

In one embodiment, the thermal storage 410 in the system 400 may include a stack of can lids 412, 414, 416, and each can lid has a can side. The can sides may take on typical light bulb geometries such as a cylinder or cone shapes. This "stacked can" configuration provides adequate heat conduction through the layers of can lids together with the can sides of the stacked can lids 412, 414, 416. Using such a geometry, the bulk temperature at any location in the PCM in the thermal storage 410 is in close proximity to the source temperature for the heating rates and volumes of interest.

In some embodiments, stacked containers may be produced with traditional automated can fabrication methods of cup forming, deep drawing, and necking (for conical forms) followed by lid forming and sealing. The result is intricate heat spreading geometries suitable to maximize the performance of PCM, created from minimal amounts of inexpensive sheet metal using long-proven automated processes. It is worth noting that containment of PCM is not limited to can fabrication methods described above. Other preferably sheet-metal based containment methods may also be employed. As non-limiting examples, nested progressively smaller cans and/or layers of "corrugated" sheets have also shown to be effective.

Heat sources may be attached to the lid, bottom, or sides or one or more of the cans in a stack of one or more cans. If necessary, additional fin-shaped structures may be embedded into the can volume at the base, sides, or lid depending on the location of heat sources.

In one embodiment, one or more of the containers 412, 414, 416 may contain a non-PCM thermal mass material, for example water, to benefit the overall thermal characteristics of the thermal storage 410 for cooling of LED 402. In terms of per unit mass and in most cases volume too, water exceeds the thermal capacity of all the metals and is dramatically less expensive per unit heat storage than the metals. The same sheet metal techniques necessary to contain PCM are inherently well suited for water containment and heat transfer too. Water in such cans further possesses unique buoyant passive convection flow characteristics, which is lacking in all solid materials and would be inherently exploited for LED cooling in specific recessed ceiling applications.

Figure 6:
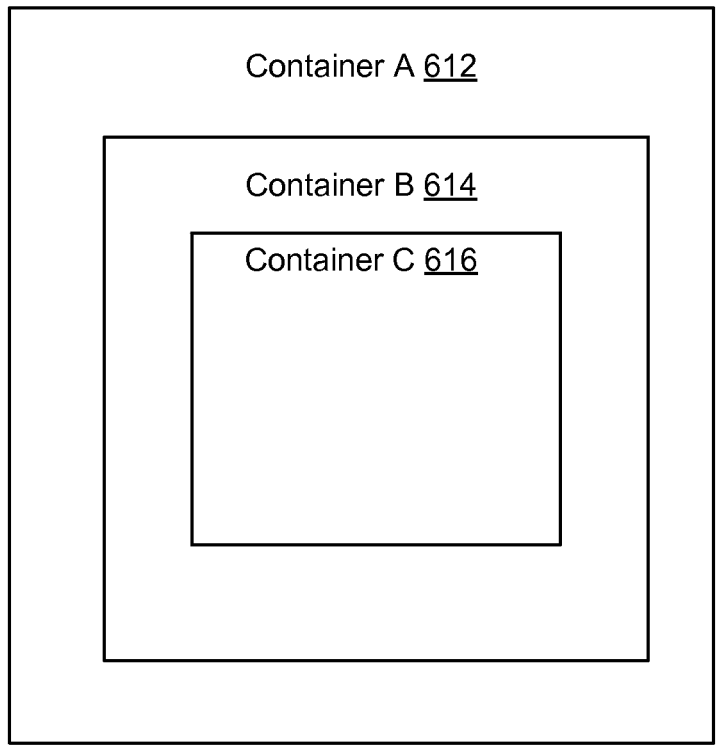
FIG. 6 depicts an example of nested PCM containers, in accordance with various embodiments.

FIG. 6 depicts an example of nested PCM containers, in accordance with various embodiments. Illustrated are nested containers 612, 614, and 616.

Figure 7:
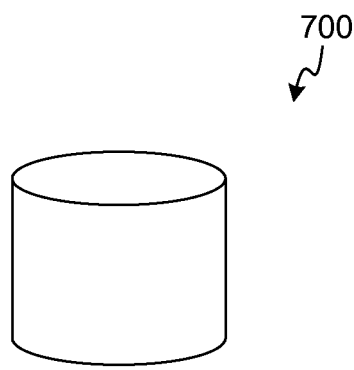
FIG. 7 is a diagram illustrating a container having a cylindrical shape, in accordance with various embodiments.

FIG. 7 is a diagram illustrating a container 700 having a cylindrical shape, in accordance with various embodiments.

In some embodiments, alternate layers of solid pancake-shaped PCM solid-state material may be embedded with layers of corrugated metal disks (not shown) progressively filling the volume of within a single can. The embedded metal disks have edge lips that are carefully sized and pressed tightly against the sides of the cans, providing the high thermal flux in the sheet metal layers between can walls and stacked disks.

The words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Embodiments were chosen and described in order to best describe the principles of the invention and its practical application, thereby enabling others skilled in the relevant art to understand the claimed subject matter, the various embodiments and with various modifications that are suited to the particular use contemplated.

The teachings of the invention provided herein can be applied to other systems, not necessarily the system described above. The elements and acts of the various embodiments described above can be combined to provide further embodiments.

While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

What is claimed is:

1. A method of controlling heat storage in a cyclically operated light emitting diode (LED) system, the LED system including a first LED, the method comprising:
    providing a first phase change material (PCM) in one or more plurality of containers thermally coupled to the first LED;
    while the LED system is turned on:
        absorbing and storing a first portion of heat generated by the LED system in the first PCM; and
        convecting a second portion of heat generated by the LED system into an atmosphere surrounding the LED system;
    while the LED system is turned off:
        releasing heat from the first PCM; and
        convecting heat away from the LED system into the atmosphere surrounding the LED system,
    wherein the first PCM is selected based upon heat storage capabilities of the first PCM, and further wherein the first PCM is to be used to cool the first LED during cyclical operation of the LED system.

2. The method as recited in claim 1, wherein the LED system further includes a second LED, and the first LED and the second LED have different operating temperatures, the method further including:

providing a second PCM in another container thermally coupled to the second LED;

wherein the first PCM is selected based on an operating temperature of the first LED, and the second PCM is selected based on an operating temperature of the second LED.

3. The method as recited in claim 1, wherein the convecting is due to temperature gradients between the surrounding atmosphere and the first LED.

4. The method as recited in claim 1, wherein the first PCM has a melting temperature that matches a working temperature of the first LED.

5. The method of claim 1, wherein the one or more containers are a plurality of containers and the plurality of containers are stacked.

6. The method of claim 1, wherein the one or more containers are a plurality of containers and the plurality of containers are nested.

7. The method of claim 1, wherein the plurality of containers are cylindrical in shape.

8. A method, comprising:

selecting one or more phase change materials (PCMs) to cool a light emitting diode (LED);

placing a plurality of containers in thermal contact with the LED, placing the one or more PCMs in at least one of the plurality of containers and providing water in at least one of the remaining of the plurality of containers;

absorbing and storing a first portion of heat generated by the LED during its operation in the one or more PCMs;

convecting a second portion of the heat generated by the LED during operation; and dissipating the heat absorbed by the one or more PCMs after the LED is turned off, wherein the one or more PCMs are selected based upon heat storage capabilities of the one or more PCMs, and operating the LED in a cyclical application.

* * * * *